(12) United States Patent
Yeo et al.

(10) Patent No.: US 7,005,330 B2
(45) Date of Patent: Feb. 28, 2006

(54) STRUCTURE AND METHOD FOR FORMING THE GATE ELECTRODE IN A MULTIPLE-GATE TRANSISTOR

(75) Inventors: Yee-Chia Yeo, Hsin-Chu (TW); Fu-Liang Yang, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 205 days.

(21) Appl. No.: 10/608,287

(22) Filed: Jun. 27, 2003

(65) Prior Publication Data

US 2004/0266077 A1  Dec. 30, 2004

(51) Int. Cl.
*H01L 21/84* (2006.01)
(52) U.S. Cl. ..................... 438/157; 438/283
(58) Field of Classification Search .......... 438/157, 438/164, 279, 283, 595
See application file for complete search history.

(56) References Cited

U.S. PATENT DOCUMENTS

| | | | |
|---|---|---|---|
| 4,933,298 A | 6/1990 | Hasegawa | |
| 4,946,799 A | 8/1990 | Blake et al. | |
| 5,317,175 A | 5/1994 | Throngnumachai | |
| 5,317,178 A | 5/1994 | Wu | |
| 5,464,783 A | 11/1995 | Kim et al. | |
| 5,607,865 A | 3/1997 | Choi et al. | |
| 5,814,895 A | 9/1998 | Hirayama | |
| 5,998,852 A | 12/1999 | Berry et al. | |
| 6,114,725 A | 9/2000 | Furukawa et al. | |
| 6,157,061 A | 12/2000 | Kawata | |
| 6,222,234 B1 | 4/2001 | Imai | |
| 6,252,284 B1 | 6/2001 | Muller et al. | |
| 6,300,182 B1 | 10/2001 | Yu | |
| 6,342,410 B1 | 1/2002 | Yu | |
| 6,344,392 B1 | 2/2002 | Liaw | |
| 6,380,024 B1 | 4/2002 | Liaw | |
| 6,387,739 B1 | 5/2002 | Smith, III | |
| 6,391,695 B1 | 5/2002 | Yu | |
| 6,391,782 B1 | 5/2002 | Yu | |
| 6,391,796 B1 | 5/2002 | Akiyama et al. | |
| 6,411,725 B1 | 6/2002 | Rhoads | |
| 6,413,802 B1 | 7/2002 | Hu et al. | |
| 6,432,829 B1 | 8/2002 | Muller et al. | |
| 6,451,656 B1 | 9/2002 | Yu et al. | |
| 6,475,869 B1 | 11/2002 | Yu | |
| 6,475,890 B1 | 11/2002 | Yu | |

(Continued)

FOREIGN PATENT DOCUMENTS

FR  2 617 642  1/1989

(Continued)

OTHER PUBLICATIONS

Huang, X., et al. "Sub-50 nm P-Channel FinFET," IEEE Transactions on Electron Devices, vol. 48, No. 5 (May 2001) pp. 880-886.

(Continued)

*Primary Examiner*—Chandra Chaudhari
(74) *Attorney, Agent, or Firm*—Slater & Matsil, L.L.P.

(57) ABSTRACT

In a method of forming semiconductor device, a semiconductor fin is formed on a semiconductor-on-insulator substrate. A gate dielectric is formed over at least a portion of the semiconductor fin. A first gate electrode material is formed over the gate dielectric and a second gate electrode material is formed over the first gate electrode material. The second gate electrode material is planarized and then etched selectively with respect to first gate electrode material. The first gate electrode material can then be etched.

69 Claims, 10 Drawing Sheets

U.S. PATENT DOCUMENTS

| | | |
|---|---|---|
| 6,476,437 B1 | 11/2002 | Liaw |
| 6,492,212 B1 | 12/2002 | Ieong et al. |
| 6,514,808 B1 | 2/2003 | Samavedam et al. |
| 6,521,949 B1 | 2/2003 | Assaderaghi et al. |
| 6,534,807 B1 | 3/2003 | Mandelman et al. |
| 6,573,549 B1 | 6/2003 | Deng et al. |
| 6,596,599 B1 | 7/2003 | Guo |
| 6,605,514 B1 | 8/2003 | Tabery et al. |
| 6,610,576 B1 * | 8/2003 | Nowak .................. 438/283 |
| 6,611,029 B1 | 8/2003 | Ahmed et al. |
| 6,617,210 B1 | 9/2003 | Chau et al. |
| 6,635,909 B1 | 10/2003 | Clark et al. |
| 6,642,090 B1 | 11/2003 | Fried et al. |
| 6,686,231 B1 * | 2/2004 | Ahmed et al. ............. 438/157 |
| 6,706,571 B1 | 3/2004 | Yu et al. |
| 6,720,231 B1 | 4/2004 | Fried et al. |
| 2002/0011612 A1 | 1/2002 | Hieda |
| 2003/0011080 A1 | 1/2003 | Deshpande et al. |
| 2003/0042528 A1 | 3/2003 | Forbes |
| 2003/0067017 A1 | 4/2003 | Ieong et al. |
| 2003/0102497 A1 | 6/2003 | Fried et al. |
| 2003/0111678 A1 | 6/2003 | Colombo et al. |
| 2003/0113970 A1 | 6/2003 | Fried et al. |
| 2003/0178670 A1 | 9/2003 | Fried et al. |
| 2004/0007715 A1 | 1/2004 | Webb et al. |
| 2004/0031979 A1 | 2/2004 | Lochtefeld et al. |
| 2004/0038464 A1 | 2/2004 | Fried et al. |
| 2004/0061178 A1 | 4/2004 | Lin et al. |
| 2004/0075122 A1 | 4/2004 | Lin et al. |
| 2004/0119100 A1 | 6/2004 | Nowak et al. |

FOREIGN PATENT DOCUMENTS

| | | |
|---|---|---|
| JP | 02-015675 | 1/1990 |

OTHER PUBLICATIONS

Yang, F-L., et al. "35nm CMOS FinFETs," 2002 Symposium on VLSI Technology Digest of Technical Papers, (Jun. 2002) pp. 109-110.

Wong, H-S.P. "Beyond the Conventional Transistor," IBM Journal of Research and Development, vol. 46, No. 2/3 (Mar./May 2002) pp. 133-167.

Chau, R. , et al. "Advanced Depleted-Substrate Transistors: Single-gate, Double-Gate and Tri-Gate," Extended Abstracts of the 2002 International Conference on Solid State Devices and Materials, (2002) pp. 68-69.

Yang, F-L., et al. "25nm CMOS Omega FETs," International Electron Devices Meeting, Digest of Technical Papers, (Dec. 2002) pp. 255-258.

Colinge, J.P., et al. "Silicon-On-Insulator Gate-All-Around Device," International Electron Devices Meeting, (1990) pp. 595-598.

Leobandung, E., et al., "Wire-Channel and Wrap-Around-Gate Metal-Oxide-Semiconductor Field-Effect Transistors with a Significant Reduction of Short Channel Effects," Journal of Vacuum Science and Technology, vol. B 15, No. 6, (Nov./Dec. 1997) pp. 2791-2794.

Auth, C.P., et al., "Scaling Theory for Cylindrical, Fully-Depleted, Surrounding-Gate MOSFET's," IEEE Electron Device Letters, vol. 18, No. 2 (Feb. 1997) pp. 74-76.

Celik, M., et al., "A 45 nm Gate Length High Performance SOI Transistor for 100nm CMOS Technology Applications," Symposium on VLSI Technology Digest of Technical Papers (2002) pp. 166-167.

Chau, R., et al., "A 50nm Depleted-Substrate CMOS Transistor (DST)," IEDM (2001) pp. 621-624.

Chen, W., et al., "Suppression of the SOI Floating-Body Effects by Linked-Body Device Structure," Symposium on VLSI Technology Digest of Technical Papers (1996) pp. 92-93.

Fung, S.K.H., et al., "Gate Length Scaling Accelerated to 30nm Regime Using Ultra-Thin Film PD-SOI Technology," IEDM (2001) pp. 629-632.

Geppert, L., "The Amazing Vanishing Transistor Act," IEEE Spectrum (Oct. 2002) pp. 28-33.

Kranti, A., et al., "Design Guidelines of Vertical Surrounding Gate (VSG) MOSFETs for Future ULSI Circuit Applications," IEEE (2001) pp. 161-165.

Je, M., et al., "Quantized Conductance of a Gate-All-Around Silicon Quantum Wire Transistor," Microprocesses and Nanotechnology Conference (1998) pp. 150-151.

Nemati, F., et al., "A Novel Thyristor-Based SRAM Cell (T-RAM) for High-Speed, Low-Voltage, Giga-Scale Memories," IEDM (1999) pp. 283-286.

Nitayama, A., et al., "Multi-Pillar Surrounding Gate Transistor (M-SGT) for Compact and High-Speed Circuits," IEEE Transactions on Electron Devices, vol. 38, No. 3 (Mar. 1991) pp. 579-583.

Oh, S-H., et al., "Analytic Description of Short-Channel Effects in Fully-Depleted Double-Gate and Cylindrical, Surrounding-Gate MOSFETs," IEEE Electron Device Letters, vol. 21, No. 9 (Sep. 2000) pp. 445-447.

Sato, N., et al., "Hydrogen Annealed Silicon-On-Insulator," Appl. Phys. Lett., vol. 65, No. 15 (Oct. 10, 1994) pp. 1924-1926.

Shahidi, G.G., "SOI Technology for the GHz Era," IBM J. Res. & Dev., vol. 46, No. 2/3 (Mar./May 2002) pp. 121-131.

Tang, S.H., et al., "FinFET—A Quasi-Planar Double-Gate MOSFET," IEEE International Solid-State Circuits Conference (2001) pp. 118-119 & 437.

Yamagata, K., et al., "Selective Growth of Si Crystals from the Agglomerated Si Seeds over Amorphous Substrates," Appl. Phys. Lett., vol. 61, No. 21 (Nov. 23, 1992) pp. 2557-2559.

* cited by examiner

STRUCTURE AND METHOD FOR FORMING THE GATE ELECTRODE IN A MULTIPLE-GATE TRANSISTOR

TECHNICAL FIELD

The present invention relates to semiconductor devices and the preferred embodiment of the present invention provides an improved structure and method for forming the gate electrode in a multiple-gate transistor.

BACKGROUND

The dominant semiconductor technology used for the manufacture of ultra-large scale integrated (ULSI) circuits is the metal-oxide-semiconductor field effect transistor (MOSFET) technology. Reduction in the size of MOSFETs has provided continued improvement in speed performance, circuit density, and cost per unit function over the past few decades. As the gate length of the conventional bulk MOSFET is reduced, the source and drain increasing interact with the channel and gain influence on the channel potential. Consequently, a transistor with a short gate length suffers from problems related to the inability of the gate to substantially control the on and off states of the channel.

Phenomena such as reduced gate control associated with transistors with short channel lengths are termed short-channel effects. Increased body doping concentration, reduced gate oxide thickness, and ultra-shallow source/drain junctions are ways to suppress short-channel effects. However, for device scaling well into the sub-50 nm regime, the requirements for body-doping concentration, gate oxide thickness, and source/drain (S/D) doping profiles become increasingly difficult to meet when conventional device structures based on bulk silicon (Si) substrates are employed. Innovations in front-end process technologies or the introduction of alternative device structures will sustain the historical pace of device scaling.

For device scaling well into the sub-30-nm regime, a promising approach to controlling short-channel effects is to use an alternative transistor structure with more than one gate, i.e. multiple-gates. An example of the alternative transistor structure is the multiple-gate transistor. A multiple-gate transistor 100 has a plan view as shown in FIG. 1.

Referring to FIG. 1, the transistor 100 includes a silicon fin 102 overlying an insulator layer 104 over a silicon substrate 114 (see FIGS. 2a, 2b or 2c). A gate dielectric (not explicitly shown) covers a portion of the silicon fin 102. A gate electrode 106 straddles across the silicon fin 102. The gate dielectric isolates the gate electrode 106 from the silicon fin 102.

Examples of the multiple-gate transistor include the double-gate transistor (as shown in U.S. Pat. No. 6,391,695, and X. Huang et al., "Sub-50 nm p-channel finFET," *IEEE Trans. Electron Devices*, vol. 48, no. 5, pp. 880–886, May 2001), triple-gate transistor (as shown in R. Chau et al., "Advanced depleted-substrate transistors: single-gate, double-gate, and tri-gate", 2002 International Conference on Solid State Devices and Materials, Nagoya, Japan, pp. 68–69, September 2002), omega field-effect transistor (FET) (as shown in F.-L. Yang et al., "25 nm CMOS Omega-FETs," *International Electron Device Meeting*, Dig. Technical Papers, December 2002), and the surround-gate or wrap-around gate transistor (as shown in J. P. Colinge et al., "Silicon-on-insulator gate-all-around device," *International Electron Device Meeting*, Dig. Technical Papers, pp. 595–598, December 1990 and E. Leobandung et al., "Wire-channel and wrap-around-gate metal-oxide-semiconductor field-effect transistors with a significant reduction of short channel effects," *J. Vacuum Science and Technology B*, vol. 15, no. 6, pp. 2791–2794, 1997). Each of these references is incorporated herein by reference.

A multiple-gate transistor structure is expected to extend the scalability of CMOS technology beyond the limitations of the conventional bulk MOSFET and realize the ultimate limit of silicon MOSFETs. The introduction of additional gates improves the capacitance coupling between the gates and the channel, increases the control of the channel potential by the gate, helps suppress short channel effects, and prolongs the scalability of the MOS transistor.

The simplest example of a multiple-gate transistor is the double-gate transistor, as described in U.S. Pat. No. 6,413,802 issued to Hu, et al. U.S. Pat. No. 6,413,802 is incorporated herein by reference. As illustrated in a cross-sectional view in FIG. 2a, the double-gate transistor 100 has a gate electrode 106 that straddles across the channel within the fin-like silicon body 102, thus forming a double-gate structure. There are two gates, one on each sidewall 108 of the silicon fin 102, and separated from the fin 102 by gate dielectric 110. An etchant mask 112 overlies a top surface of fin 102. The plan view of the double-gate structure is shown in FIG. 1.

In U.S. Pat. No. 6,413,802, the transistor channel comprises a thin silicon fin defined using an etchant mask and formed on an insulator layer, e.g. silicon oxide. Gate oxidation is performed, followed by gate deposition and gate patterning to form a double-gate structure overlying the sides of the fin. Both the source-to-drain direction and the gate-to-gate direction are in the plane of the substrate surface.

Another example of the multiple-gate transistor is the triple-gate transistor. A cross-section of the triple-gate transistor 100' is illustrated in FIG. 2b and thus the plan view of the triple-gate structure is the same as the double gate structure shown in FIG. 1. The triple-gate transistor structure 100' has a gate electrode 106 that forms three gates: one gate on the top surface 116 of the silicon body/fin 102, and two gates on the sidewalls 108 of the silicon body/fin 102. The triple-gate transistor achieves better gate control than the double-gate transistor because of it has one more gate on the top of the silicon fin.

The triple-gate transistor structure may be modified for improved gate control, as illustrated in FIG. 2c. Such a structure 100', is also known as the Omega ($\Omega$) field-effect transistor (FET), or simply omega-FET, since the gate electrode 106 has an omega-shape in its cross-sectional view. The encroachment of the gate electrode 106 under the semiconductor fin or body 102 forms an omega-shaped gate structure. This encroachment results in notch or undercut region 118 as shown in FIG. 2c. It closely resembles the Gate-All-Around (GAA) transistor for excellent scalability, and uses a very manufacturable process similar to that of the double-gate or triple-gate transistor.

The omega-FET has a top gate, adjacent surface 110, two sidewall gates, adjacent sidewalls 108, and special gate extensions or encroachments 118 under the fin-like semiconductor body 102. The omega-FET is therefore a field effect transistor with a gate electrode 106 that almost wraps around the body. In fact, the longer the gate extension, i.e., the greater the extent of the encroachment E, the more the structure approaches or resembles the gate-all-around structure. The encroachment of the gate electrode 106 under the silicon body 102 helps to shield the channel from electric field lines from the drain and improves gate-to-channel controllability, thus alleviating the drain-induced barrier lowering effect and improving short-channel performance.

The multiple-gate transistor structures described, e.g., the double-gate transistor, the triple-gate transistor, and the omega-FET, have a common feature: a gate electrode 106 that straddles across the fin-like semiconductor active region 102. The formation of the gate electrode 106 involves a definition step using techniques such as photolithography, and an etching step. The formation of the gate electrode 106 over a large step height introduced by the semiconductor fin 102 presents a very challenging problem. For example, if the top surface of the gate electrode 106 is not substantially flat, the patterning of the gate electrode using lithographic methods can be difficult due to focusing problems.

FIG. 3 shows a prior art process for forming a gate electrode 106 in a multiple-gate transistor. In FIG. 3a, a gate electrode material 120 is deposited over a semiconductor fin 102 and covered with a gate dielectric 110. As shown, the top surface of the gate electrode material 120 is non-planar due to the fin 102.

A mask material 122 such as a photoresist is then deposited on the gate electrode material 120, as shown in FIG. 3b. The top surface of the mask material is usually a planar surface. As a result, the thickness of the mask material varies from $t_1$ in one region to $t_2$ in another region.

A lithographic mask 124 that includes an opaque region 126 and a transparent region 128 will be used to pattern the mask material 122. The pattern on the lithographic mask 124, however, may not be accurately transferred to the mask material 122 due to the varying thickness of the mask material 122. As a result, the patterned mask material 130 may be formed with different widths, as shown in FIG. 3c. When the gate electrode material 120 is subsequently etched, as shown in FIGS. 3d and 3e, the gate electrode 106 may be formed with a non-uniform gate length. The uniformity of the critical gate length dimension is therefore adversely affected.

The present invention provides simple and improved methods for the formation of the gate electrode in a multiple-gate transistor.

SUMMARY OF THE INVENTION

These and other problems are generally solved or circumvented, and technical advantages are generally achieved, by preferred embodiments of the present invention which provide a structure and method for forming the gate electrode in a multiple-gate transistor.

In accordance with a preferred embodiment of the present invention, a method for forming a gate electrode of a multiple-gate transistor includes providing a semiconductor structure that includes a semiconductor fin overlying an insulator layer. The structure also includes a gate dielectric overlying at least a portion of the semiconductor fin. First and second gate electrode material are formed over the gate dielectric. A patterned mask is formed over a second gate electrode material, and the first and second gate electrode materials are etched.

In accordance with another preferred embodiment of the present invention, a structure for a multiple-gate transistor includes a semiconductor fin overlying an insulator layer. A gate dielectric overlies at least a portion of the semiconductor fin. A gate electrode overlies the gate dielectric and includes a first gate electrode material underlying a second gate electrode material. Source and drain regions are formed in portions of the semiconductor fin oppositely adjacent to said gate electrode.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The preferred embodiments of the present invention provide several improved methods for the formation of semiconductor devices and the resulting structures. These embodiments will now be described in the context of the formation of the gate electrode in a multiple-gate transistor.

Multiple-gate transistors such as the double-gate transistor, the triple-gate transistor, the omega-FET, have a common feature: a gate electrode that straddles across a semiconductor fin-like active region. Such devices are also known as semiconductor fin devices or FinFETs. The semiconductor fin has a predetermined fin height h and a predetermined fin width w. Another common feature of multiple-gate transistors is that the sidewall surfaces of the semiconductor fins are used for current conduction. A significant amount of source-to-drain current in a typical multiple-gate transistor is carried along the sidewall surfaces. Essentially, the effective device width of the multiple-gate transistor is a function of the fin height h. The larger the fin height, the large amount of current the device can deliver. However, when the fin height is large, the formation of the gate electrode becomes very challenging. The preferred embodiment of this invention teaches a structure and method for forming the gate electrode of the multiple-gate transistor and may be better understood in the following embodiments.

Figure 4:
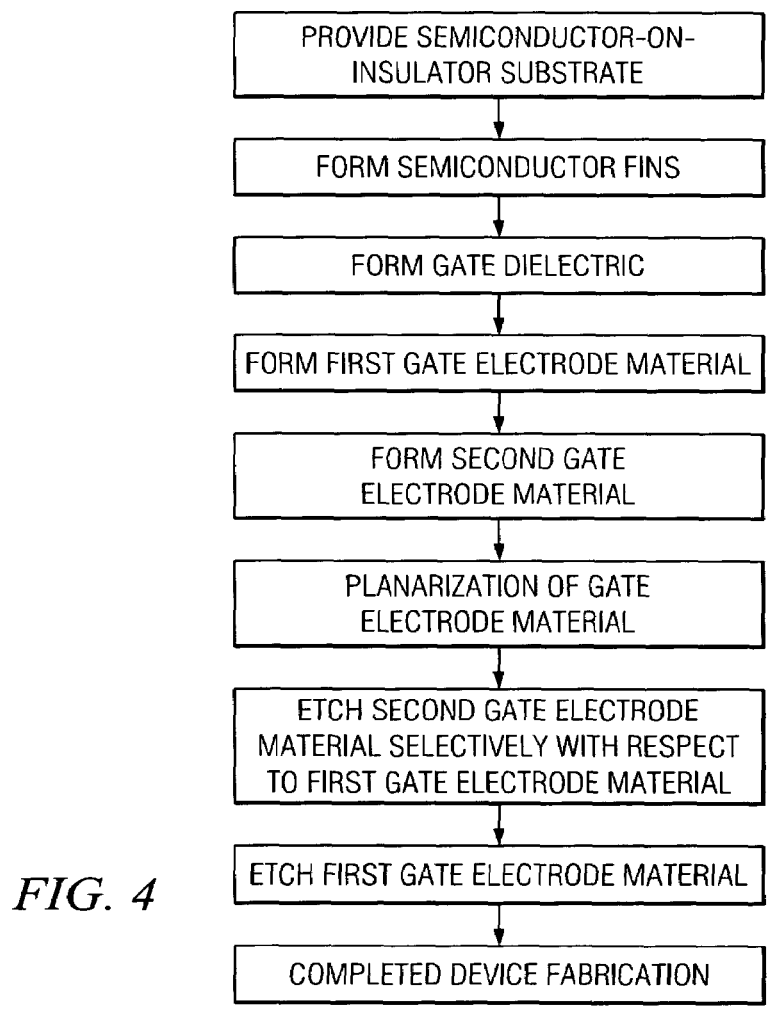
FIG. 4 is a flow chart showing a method of forming gate electrode.
Figure 3A:
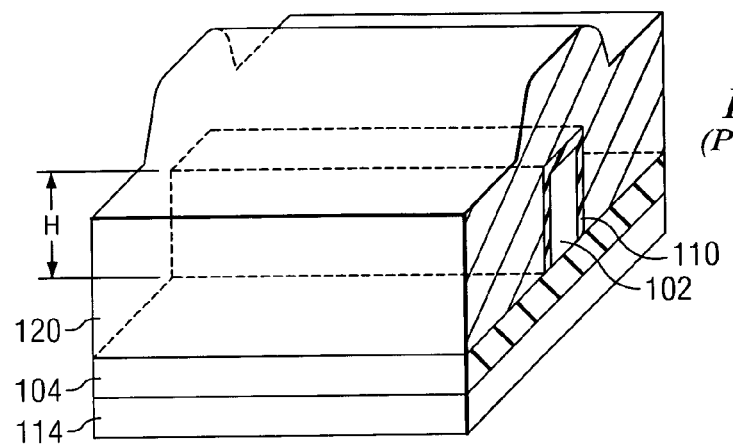
FIGS. 3a–3e illustrate a conventional process flow for forming a multiple gate transistor.
Figure 3B:
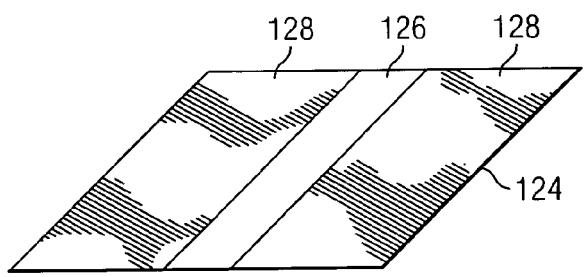
Figure 3B:
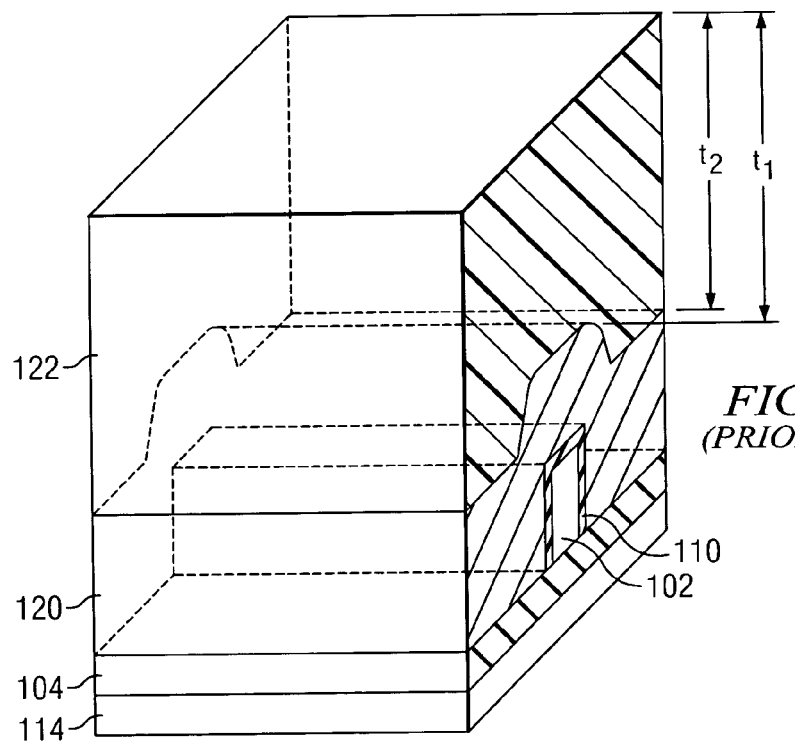
Figure 3C:
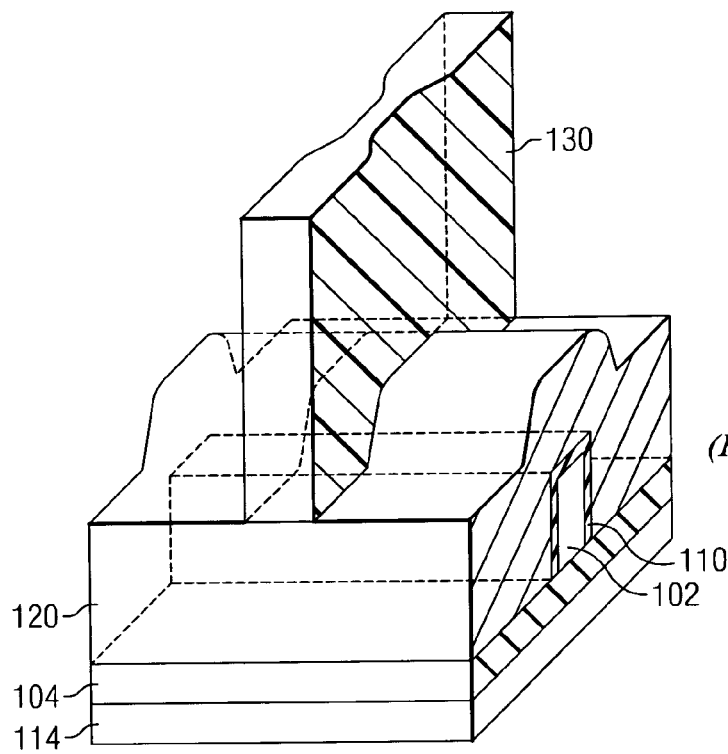
Figure 3D:
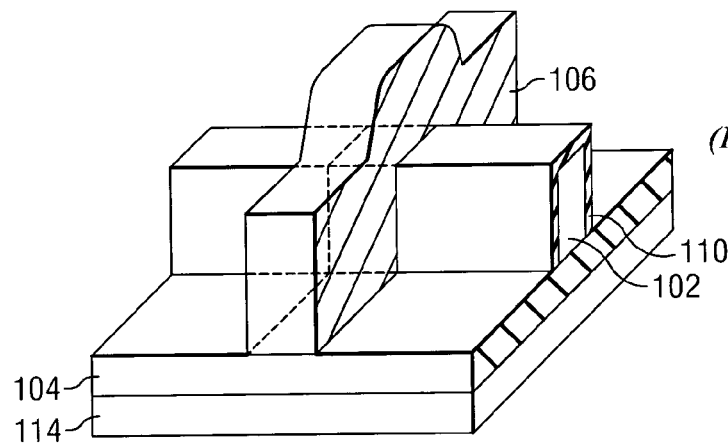
Figure 3E:
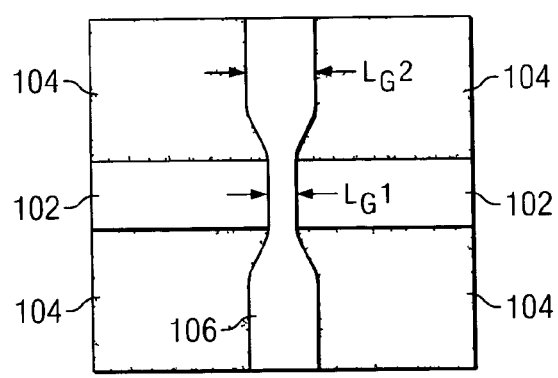
Figure 5A:
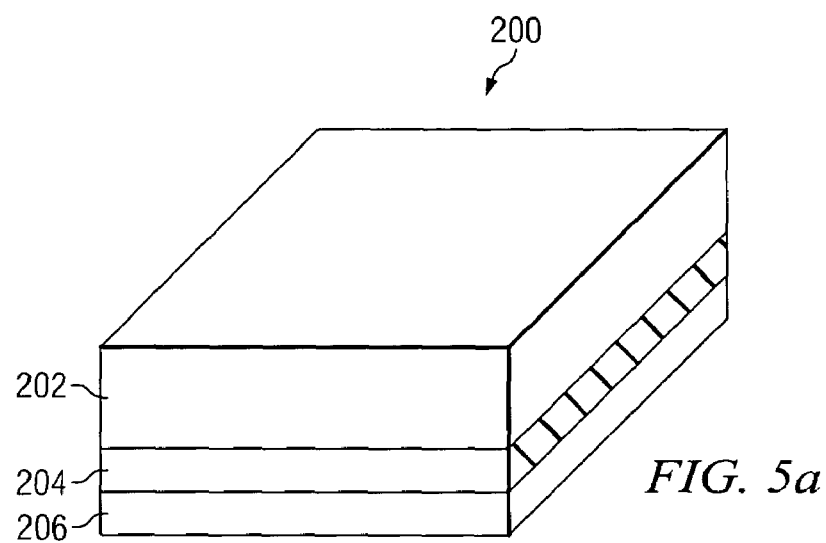
FIGS. 5a–5i illustrate a process flow of the present invention for forming a multiple gate transistor.

A method of forming a gate electrode of the multiple-gate transistor is illustrated using the flow chart of FIG. 4. Three-dimensional perspectives of the multiple-gate transistor during the various process steps described in FIG. 4 are illustrated in FIGS. 5a–5i. The formation of device 200 begins with a semiconductor-on-insulator substrate that includes a semiconductor layer 202 overlying an insulator layer 204, as shown in FIG. 5a. The insulator layer 204 overlies a substrate 206. The semiconductor layer 202 may be formed from an elemental semiconductor such as silicon, an alloy semiconductor such as silicon-germanium, or a compound semiconductor such as gallium arsenide or indium phosphide. The semiconductor layer 202 is preferably silicon. The thickness of the semiconductor layer may be in the range of about 200 angstroms to about 5000 angstroms. In an alternate embodiment, bulk semiconductor substrates such as a bulk silicon substrate may also be used.

The insulator layer 204 may be formed from any dielectric or insulator, and is preferably comprised of silicon oxide or silicon nitride or a structured combination of both. The insulator layer 204 may have a thickness in the range of about 100 angstroms to about 2000 angstroms, although it is understood that thinner or thicker thicknesses may be used. The substrate 206 may be a silicon substrate, for example.

Figure 5B:
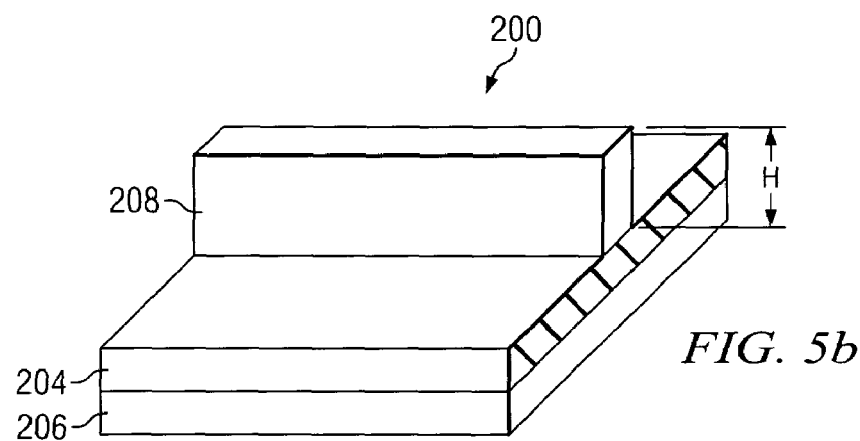

Referring now to FIG. 5b, at least one semiconductor fin 208 is formed by patterning the semiconductor layer 202. The semiconductor fin patterning process may be accomplished by depositing a commonly used mask material (not shown) such as photoresist or silicon oxide over the semiconductor layer 202. The mask material is then patterned and the semiconductor layer is etched in accordance with the pattern. In this manner, a semiconductor structure including at least one semiconductor fin overlying an insulator layer is formed.

Figure 5C:
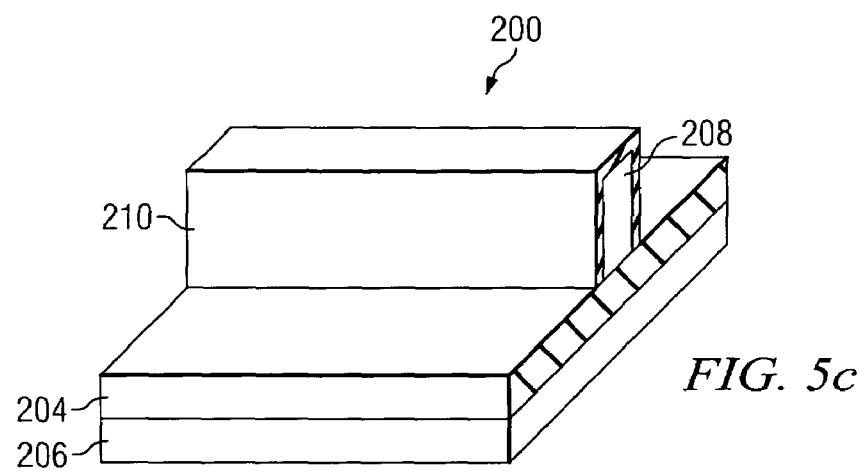

A gate dielectric layer 210 is then formed on the semiconductor fin 208, as shown in FIG. 5c. The gate dielectric 210 may be formed by thermal oxidation, chemical vapor deposition, sputtering, or any other methods known and used in the art for forming a gate dielectric. Depending on the technique of gate dielectric formation, the gate dielectric 210 thickness on the top of the fin 208 may be different from the gate dielectric thickness on the fin sidewall. In one embodiment, the gate dielectric thickness on the top surface of the fin is less than 20 angstroms.

The gate dielectric 210 may be formed from a material such as silicon dioxide or silicon oxynitride with a thickness ranging from about 3 angstroms to about 100 angstroms, preferably less than about 10 angstroms. The gate dielectric 210 may alternatively be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride HfON, or zirconium oxide ($ZrO_2$), or combinations thereof, with an equivalent oxide thickness of 3 angstroms to 100 angstroms.

Figure 5D:
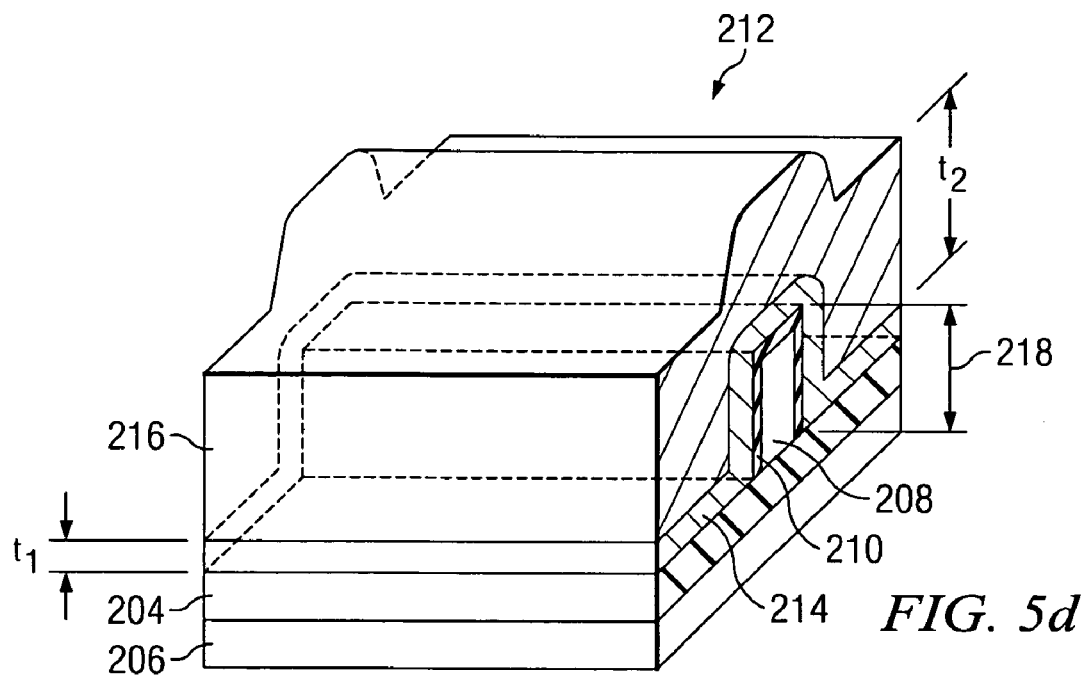

Next, as shown in FIG. 5d, gate electrode material 212 is deposited. In this embodiment, the gate electrode material 212 includes a first gate electrode material 214 underlying a second gate electrode material 216. In other embodiments, additional gate electrode materials may be included. According to this embodiment, the first and second gate electrode materials 214 and 216 have substantially different etch rates in a gate electrode etching process. The first and second gate electrode materials are conductive materials.

The first gate electrode material 214 acts as an etch-stop layer for the etching of the second gate electrode material 216. In the preferred embodiment, the first and second gate electrode materials may be selected from polycrystalline-silicon (poly-Si), poly-crystalline silicon-germanium (poly-SiGe), metallic nitrides, metallic suicides, metallic oxides, and metals. Examples of metallic nitrides include tungsten nitride, molybdenum nitride, titanium nitride, and tantalum nitride, or their combinations. Examples of metallic silicide include tungsten silicide, titanium silicide, cobalt silicide, nickel silicide, platinum silicide, erbium silicide, or their combinations. Examples of metallic oxides include ruthenium oxide, indium tin oxide, or their combinations. Examples of metal include tungsten, titanium, aluminum, copper, molybdenum, nickel, platinum, and others.

The first and second gate electrode materials 214 and 216 may be deposited by chemical vapor deposition (CVD), by sputter deposition, or by other techniques known and used in the art for depositing conductive materials. The thickness of the first or the second gate electrode material may be in the range of about 200 angstroms to about 4000 angstroms.

In one embodiment, the first gate electrode material 214 is a metallic nitride, and the second gate electrode material 216 is selected from polycrystalline-silicon (poly-Si), polycrystalline silicon-germanium (poly-SiGe), metallic nitrides, metallic silicides, metallic oxides, and metals. For example, the first gate electrode material 214 is tantalum nitride, and the second gate electrode material 216 is nickel silicide. In another embodiment, the first gate electrode material 214 is a metal, and the second gate electrode material 216 is selected from poly-Si, poly-SiGe, metallic nitrides, metallic silicides, metallic oxides, and metals.

After deposition, the top surface of the second gate electrode material 216 usually has a non-planar top surface, as shown in FIG. 5d. The non-planar surface may have a step height that is proportional (sometimes approximately equal) to the fin height 218. The step height can introduce significant problems in the transfer of a predefined pattern from a lithographic mask onto the gate electrode material 212. Ions may or may not be introduced into the gate electrode material 212 at this point. Ions may be introduced, for example, by ion implantation techniques. The ion implantation introduces the dopants such that a peak dopant concentration occurs at an implant depth below the non-planar top surface.

Figure 5E:
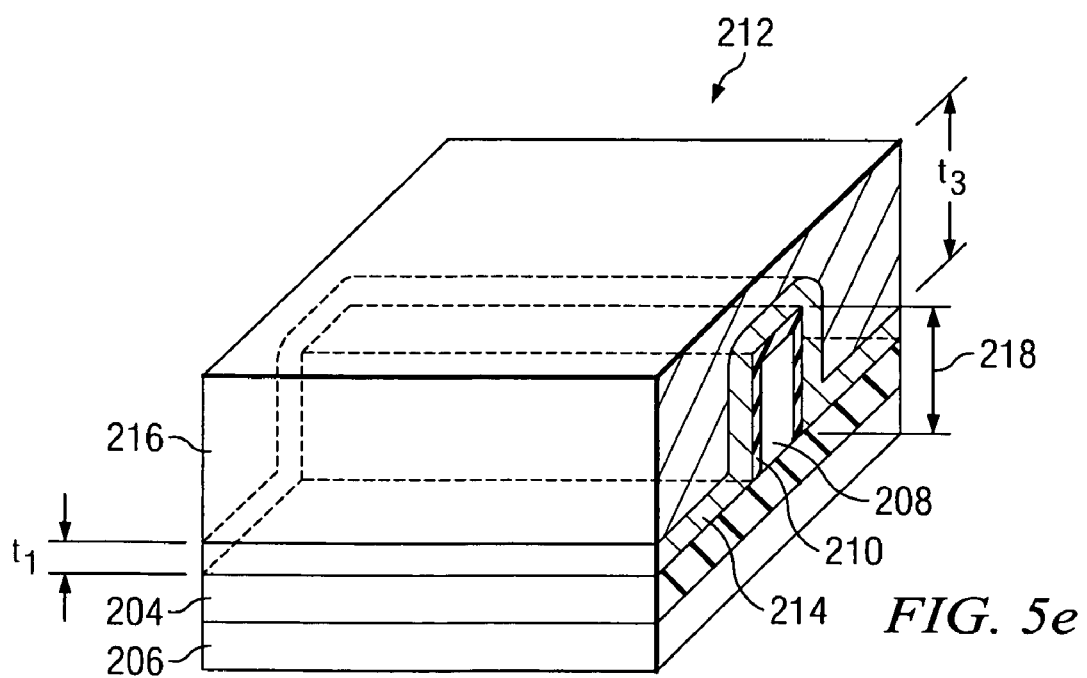
Figure 8:
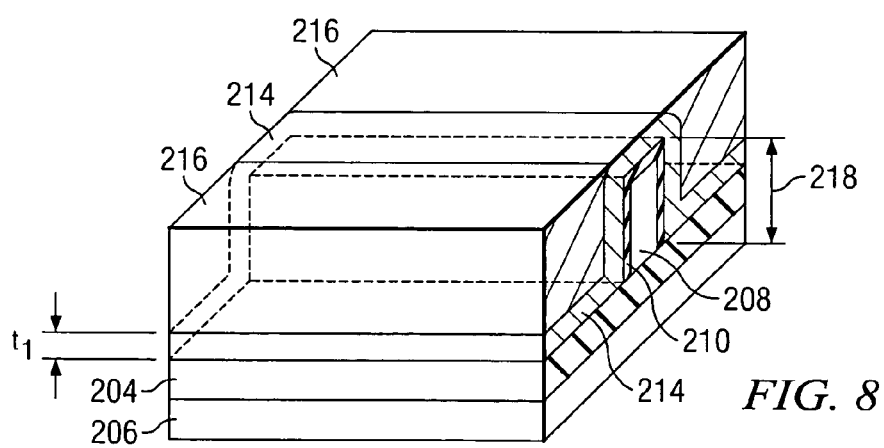
FIG. 8 is a perspective view showing the case where the CMP process exposes the first gate electrode material.

Referring next to FIG. 5e, a chemical mechanical polishing (CMP) process is performed to planarize the top surface of the second gate electrode material 216. The CMP process may or may not expose the first gate electrode material 214. In FIG. 5e, the CMP process does not expose first gate electrode material 214. FIG. 8 is provided to show the case where the first gate electrode material 214 is exposed. The root-mean-square surface roughness of the planarized top surface of the gate electrode material 212 is preferably less than 100 angstroms.

Figure 5F:
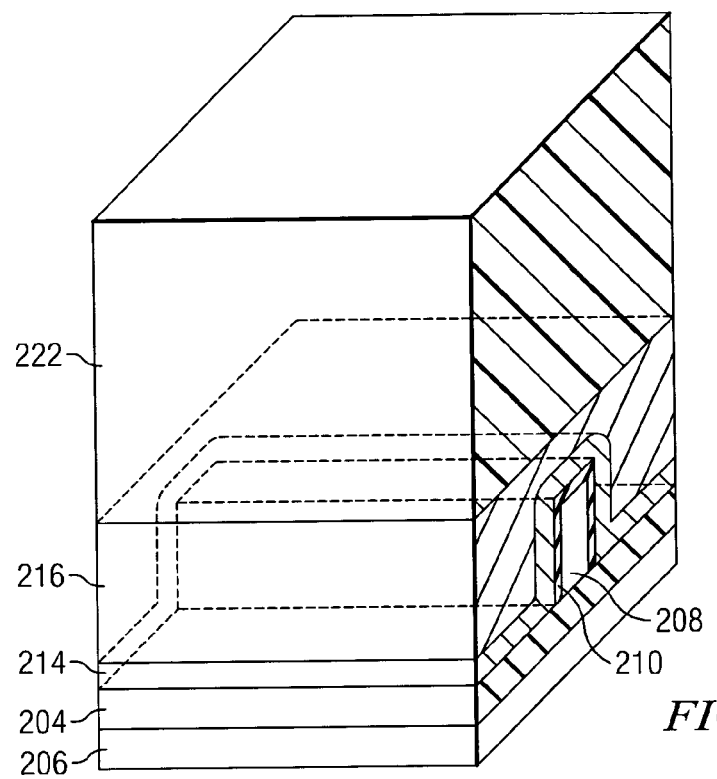
Figure 5G:
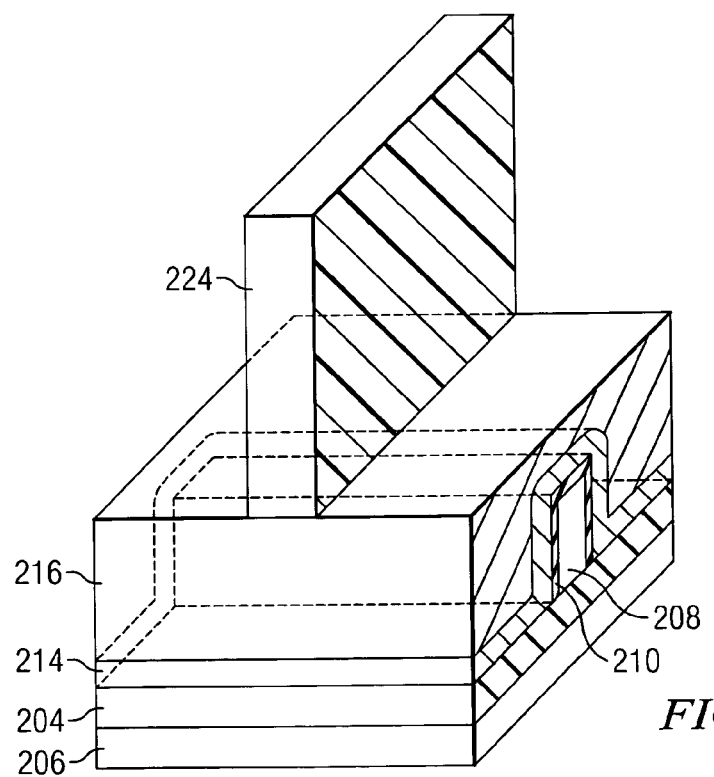

The definition of gate electrode 220 (see FIG. 5i) will now be described with respect to FIGS. 5e–5i. A mask material 222 is formed on the substantially planarized top surface of the gate electrode material 216, as shown in FIG. 5f. The mask material 222 is then patterned to create a patterned mask 224 as shown in FIG. 5g. As a result of the substantially planarized top surface, a desired predefined pattern can be accurately transferred onto the mask material 222 to form a patterned mask 224.

Figure 5H:
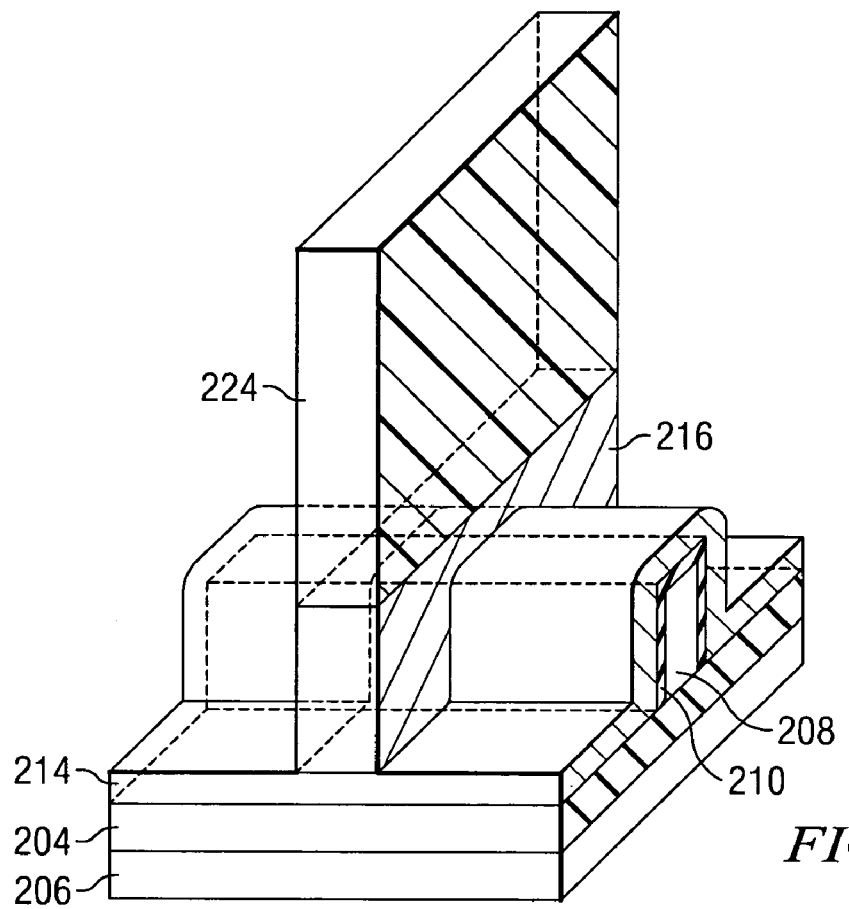

Referring to FIG. 5h, the pattern is transferred to the second gate electrode material 216 by an etching process, preferably a dry plasma etching process. Since the second gate electrode material 216 and the first gate electrode material 214 have substantially different etch rates, the etching of the second gate electrode material can stop on the first gate electrode material. The resulting structure is shown in FIG. 5h.

The first gate electrode material 214 may then be etched, stopping on the insulator layer 204. The etching of the first gate electrode material 214 may be accomplished using a dry plasma etching process or a wet etching process. For example, if the first gate electrode material 214 is titanium nitride, the dry plasma etching process can be a plasma etching process employing fluorine chemistry, and the wet etching process may employ an etchant comprising ammonia hydroxide and hydrogen peroxide. Such a wet etchant etches the titanium nitride first gate electrode material with a high selectivity with respect to the underlying silicon oxide insulator layer.

Figure 5I:
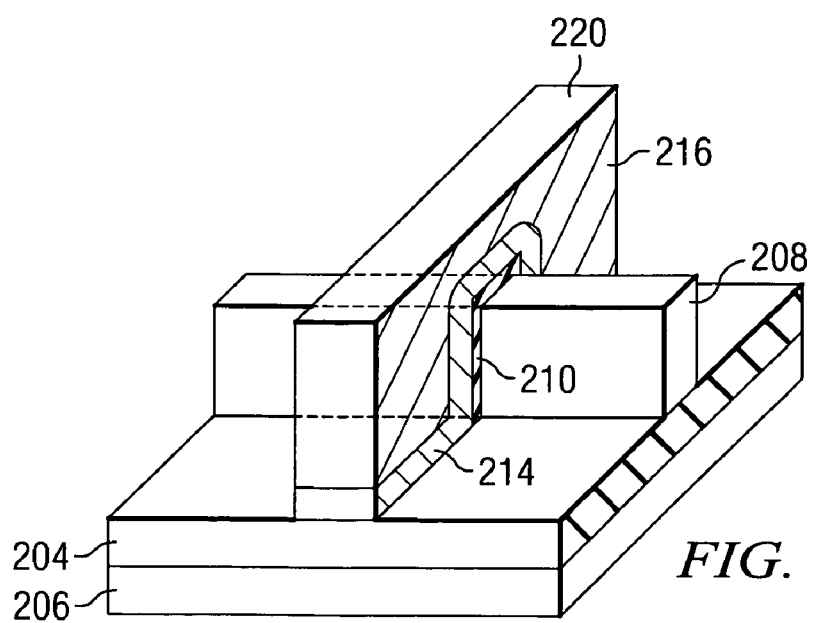

The patterned mask 224 may then be removed as shown in FIG. 5i. The portion of the gate dielectric 210 not covered by the gate electrode 220 may or may not be removed during the etching process. In the case where some gate dielectric remains on the semiconductor fin 208 not covered by the gate electrode 220, the gate dielectric 210 may be subsequently removed by dry or wet etching.

Figure 1:
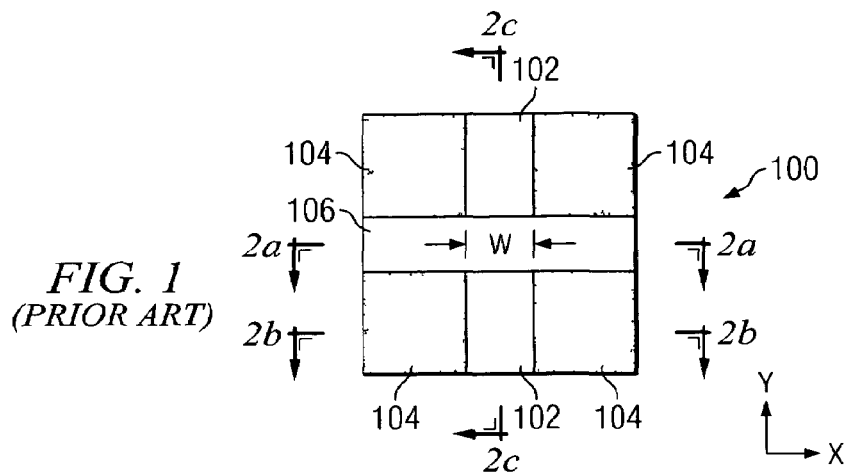
FIG. 1 is a plan view of a multiple gate transistor.
Figure 2A:
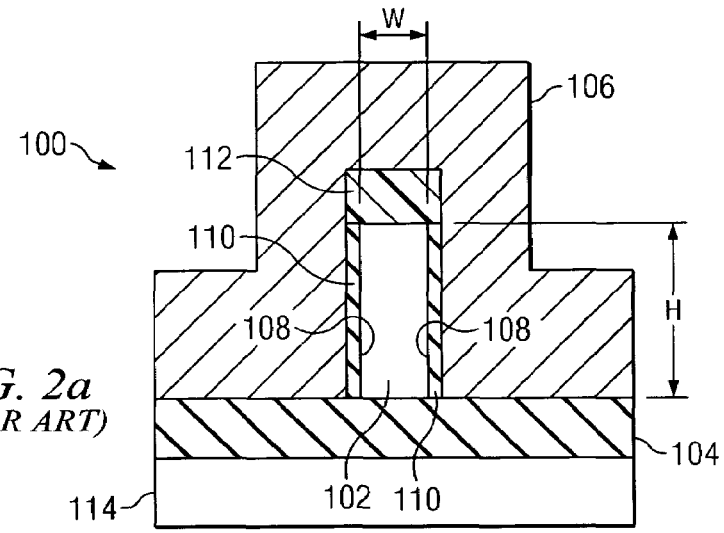
FIG. 2a is a cross-sectional view of the double-gate transistor.
Figure 2B:
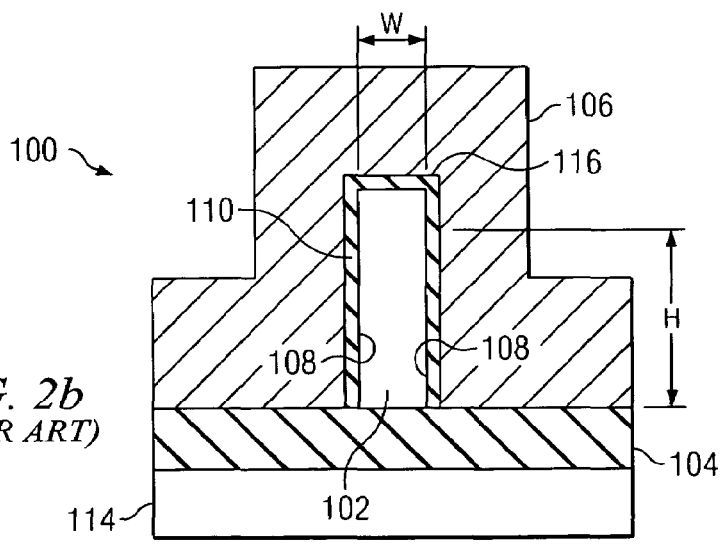
FIG. 2b is a cross-sectional view of the triple-gate transistor.
Figure 2C:
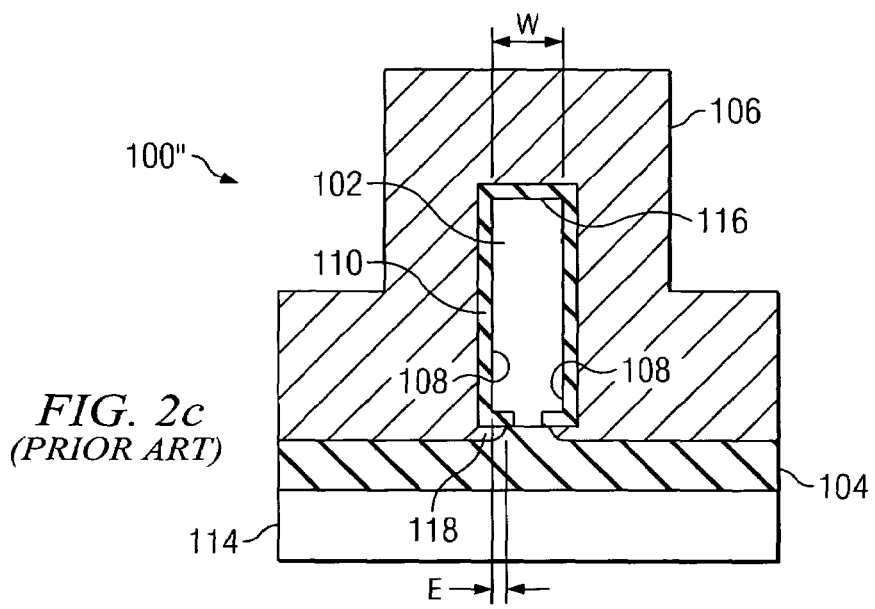
FIG. 2c is a triple-gate structure with recessed insulator.

The process of FIGS. 5a–5i illustrated the formation of a triple-gate transistor device. It is understood that similar process steps could be used to form any other multiple gate transistor. For example, an etchant mask (see element 112 in FIG. 2a) can be formed over the semiconductor fin 208. Similarly, the insulating layer 204 can be recessed, resulting in a notch (see element 118 of FIG. 2c) at the base of the semiconductor fin 208. Any of the other features incorporated in FIGS. 2a, 2b and 2c could similarly be incorporated in a device of the present invention.

Figure 6:
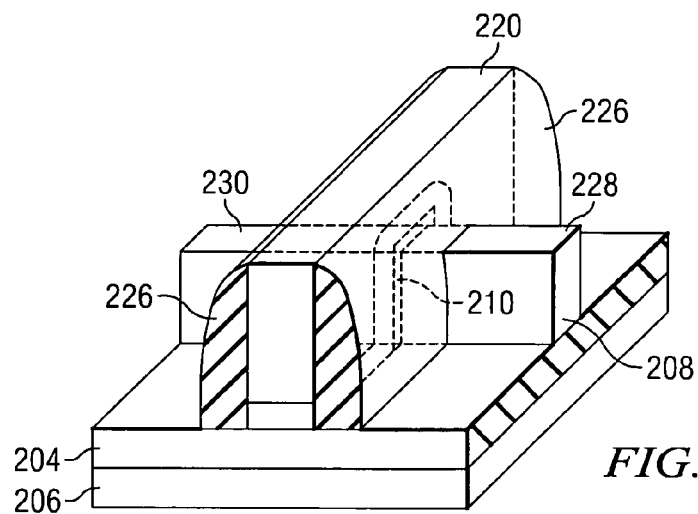
FIG. 6 is a perspective view showing formation of spacers.

Referring now to FIG. 6, the source and drain regions may then be formed. The formation of the source and drain regions may involve many steps. In the preferred embodiment, an ion implantation process is first performed to dope the source and drain regions 228 and 230 immediately adjacent to the channel region. The channel region is the portion of the semiconductor fin 208 wrapped around by the gate dielectric 210 and the gate electrode 220.

Spacers 226 are then formed on the sidewalls of the gate electrode 220. The spacers 226 may be formed by deposition of a spacer material followed by anisotropic etching of the spacer material. The spacer material comprises of a dielectric material, preferably silicon nitride but alternately silicon oxide or another insulating material. The spacer material may also be comprised of a stack of dielectric materials, such as a silicon nitride layer overlying a silicon oxide layer.

Figure 7:
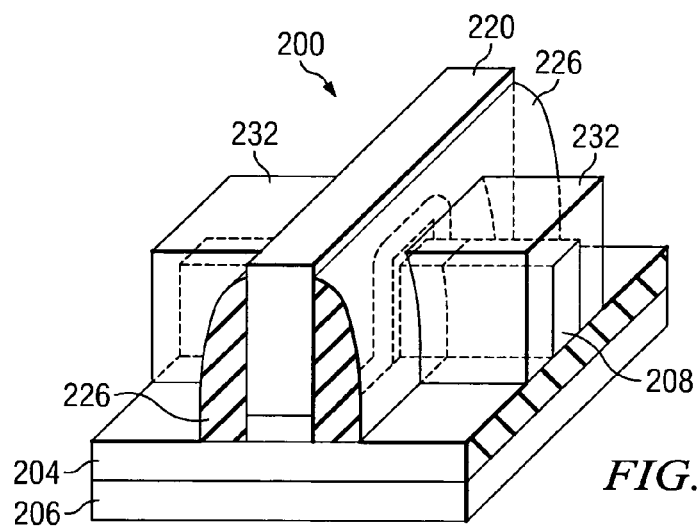
FIG. 7 is a perspective view showing epitaxial source and drain regions.

In the preferred embodiment, a selective epitaxy is performed to increase the width and height of the fin in the source and drain regions 228 and 230. The selective epitaxy results in epitaxial growth in the source and drain regions, and perhaps the gate electrode region. Epitaxial layer 232 shown in FIG. 7 illustrates this feature.

An optional ion implantation is then performed to dope the source and drain regions 228 and 230. For example, the ion implantation process can be performed if the selective epitaxy does not incorporate dopants into the grown regions during epitaxial growth.

Figure 9A:
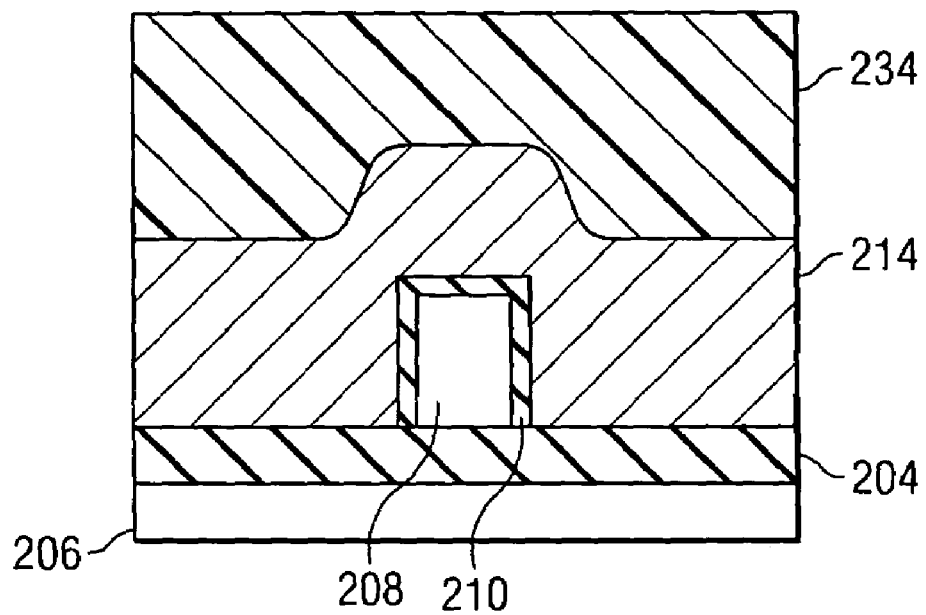
FIGS. 9a and 9b are cross-sectional views showing a planarization material.
Figure 9B:
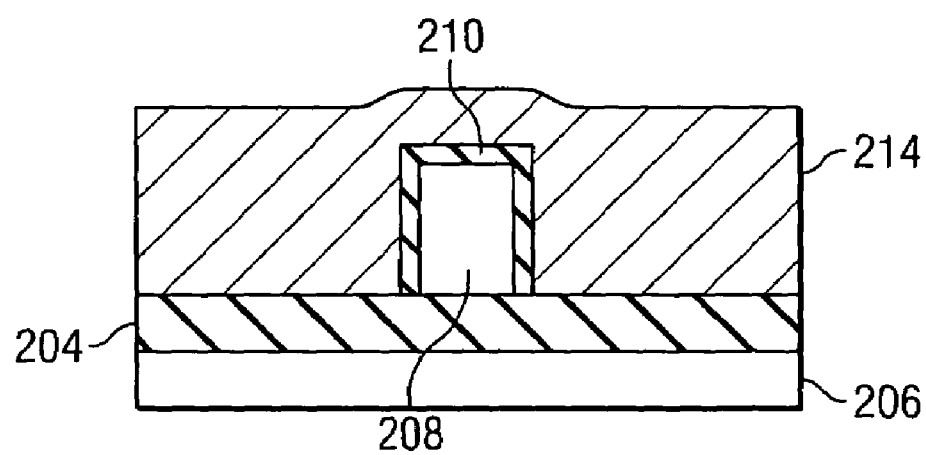

FIGS. 9a and 9b illustrate an alternate embodiment of the present invention. FIG. 9a begins with the structure of FIG. 5d. In other words, each of the steps described above with respect to FIGS. 5a–5d can be performed in the alternate embodiment. In the alternate embodiment, however, only one conductive gate electrode material is necessary. As a result, FIG. 9a shows only a single gate electrode material 214. It is understood, however, that two or more materials can be used.

Referring now to FIG. 9a, a planarizing material 234 is formed above gate electrode material 214. Planarizing material 234 is preferably a dielectric but any material can be used. Preferably, planarizing material 234 should have an etch rate that is substantially the same as the etch rate of gate electrode material 214 for a given etching process. The planarizing material 234 should also be a material that can be deposited in a substantially planar manner (e.g., smooth within about 100 angstroms peak to valley). In the preferred embodiment, the planarizing material is chemical-vapor-deposited silicon-rich oxide when the gate electrode material is polysilicon. In other embodiments, the planarizing material can be spin-on glass, silicon oxide, or doped glass (e.g., BPSG, PSG, or FSG).

Referring now to FIG. 9b, the planarizing material 234 and the gate electrode material 214 are etched to create a substantially planar top surface. Preferably, the entire layer of planarizing material 234 is removed. The etching process can be an etch back using a fluorine or chlorine etch chemistry with a gate electrode material of polysilicon and a planarizing layer of silicon-rich oxide. Alternatively, a chemical mechanical polish step can be used.

While several embodiments of the invention, together with modifications thereof, have been described in detail herein and illustrated in the accompanying drawings, it will be evident that various modifications are possible without departing from the scope of the present invention. The examples given are intended to be illustrative rather than exclusive. The drawings may not necessarily be to scale and features may be shown in a schematic form.

What is claimed is:

1. A method of forming a gate electrode of a multiple-gate transistor comprising:
    providing a semiconductor structure including a semiconductor fin overlying an insulator layer, and a gate dielectric overlying at least a portion of the semiconductor fin;
    forming a first gate electrode material overlying the gate dielectric;
    forming a second gate electrode material overlying the first gate electrode material;
    forming a patterned mask over the second gate electrode material;
    etching the second gate electrode material; and
    etching the first gate electrode material.

2. The method of claim 1 further comprising planarizing a non-planar top surface of the second gate electrode material to form a planarized top surface.

3. The method of claim 2 wherein the non-planar top surface is substantially conformal with respect to the semiconductor structure.

4. The method of claim 2 wherein planarizing a non-planar top surface comprises performing a chemical mechanical polishing process.

5. The method of claim 2 wherein the planarizing step exposes the first gate electrode material.

6. The method of claim 1 further comprising forming source and drain regions in the semiconductor fin.

7. The method of claim 1 further comprising:
    forming spacers on the sides of the gate electrode;
    performing selective epitaxy on the portions of the semiconductor fin not covered by the gate electrode; and
    forming source and drain regions.

8. The method of claim 1 wherein the semiconductor fin comprises a silicon fin.

9. The method of claim 1 wherein the semiconductor fin comprises a silicon and germanium fin.

10. The method of claim 1 wherein the patterned mask comprises a mask material selected from a group consisting of silicon nitride, silicon oxynitride, silicon oxide, and photoresist, and combinations thereof.

11. The method of claim 1 wherein the etching of the second gate electrode material comprises performing a plasma etching process.

12. The method of claim 11 wherein the plasma etching process etches the second gate electrode material at a faster etch rate than it etches the first gate electrode material.

13. The method of claim 1 wherein the etching of the second gate electrode material stops on the first gate electrode material.

14. The method of claim 1 wherein the etching of the first gate electrode material comprises performing a plasma etching process or a wet etching process.

15. The method of claim 1 wherein the gate dielectric comprises silicon oxide.

16. The method of claim 1 wherein the gate dielectric comprises silicon oxynitride.

17. The method of claim 1 wherein the gate dielectric comprises a high permittivity material.

18. The method of claim 17 wherein the gate dielectric comprises a material selected from the group consisting of lanthanum oxide, aluminum oxide, hafnium oxide, hafnium oxynitride, and zirconium oxide, and combinations thereof.

19. The method of claim 17 wherein the gate dielectric comprises of high permittivity materials with relative permittivity greater than about 5.

20. The method of claim 1 wherein the gate dielectric has a thickness less than about 10 angstroms.

21. The method of claim 1 wherein the first gate electrode material is selected from a group consisting of poly-Si, poly-SiGe, a metallic nitride, a metallic silicide, a metal, and combinations thereof.

22. The method of claim 1 wherein the second gate electrode material is selected from a group consisting of poly-Si, poly-SiGe, a metallic nitride, a metallic silicide, a metal, and combinations thereof.

23. The method of claim 1 wherein the first gate electrode material comprises a metallic nitride, and the second gate electrode material is selected from the group consisting of poly-Si, poly-SiGe, a metallic nitride, a metallic silicide, and a metal.

24. The method of claim 1 wherein the first gate electrode material comprises a metal, and the second gate electrode material is selected from a group consisting of poly-Si, poly-SiGe, a metallic nitride, a metallic silicide, a metal, and combinations thereof.

25. The method of claim 1 wherein the multiple-gate transistor is a triple-gate transistor.

26. The method of claim 1 wherein the multiple-gate transistor is a double-gate transistor.

27. A method of forming a semiconductor device, the method comprising:
    providing a semiconductor-on-insulator substrate;
    forming a semiconductor fin on the semiconductor-on-insulator substrate;
    forming a gate dielectric over at least a portion of the semiconductor fin;
    forming a first gate electrode material overlying the gate dielectric;
    forming a second gate electrode material overlying the first gate electrode material;
    planarizing the second gate electrode material;
    etching the second gate electrode material selectively with respect to the first gate electrode material; and
    etching the first gate electrode material.

28. The method of claim 27 and further comprising forming source and drain regions in the semiconductor fin after etching the first gate electrode material.

29. The method of claim 28 and further comprising forming sidewall spacers along sidewalls of the semiconductor fin prior to forming the source and drain regions.

30. The method of claim 27 wherein planarizing the second gate electrode material comprises performing a chemical mechanical polishing process.

31. The method of claim 30 wherein the planarizing step exposes the first gate electrode material.

32. The method of claim 27 wherein the gate dielectric comprises a high permittivity material with a relative permittivity greater than about 5.

33. The method of claim 27 wherein the first gate electrode material is selected from a group consisting of poly-Si, poly-SiGe, a metallic nitride, a metallic silicide, a metal, and combinations thereof.

34. The method of claim 27 wherein the second gate electrode material is selected from a group consisting of poly-Si, poly-SiGe, a metallic nitride, a metallic silicide, a metal, and combinations thereof.

35. The method of claim 34 wherein the first gate electrode material comprises a metallic nitride, and the second gate electrode material is selected from the group consisting of poly-Si, poly-SiGe, a metallic nitride, a metallic silicide, and a metal.

36. A method of forming a multiple gate transistor device, the method comprising:
    providing a semiconductor structure including a semiconductor fin overlying an insulator layer, and a gate dielectric overlying at least a portion of the semiconductor fin;
    forming a gate electrode material over the gate dielectric;
    forming a planarizing layer over the gate electrode material;
    etching the planarizing layer and the gate electrode material to form a gate electrode layer with a substantially planar upper surface; and
    patterning and etching the gate electrode material to form a gate electrode.

37. The method of claim 36 wherein etching the planarizing layer and the gate electrode material comprises performing an etch back process.

38. The method of claim 36 wherein etching the planarizing layer and the gate electrode material comprises performing a chemical-mechanical polish process.

39. The method of claim 36 wherein the planarizing layer comprises a dielectric layer.

40. The method of claim 36 and further comprising forming a second gate electrode layer over the gate dielectric before forming the gate electrode material.

41. The method of claim 36 further comprising forming source and drain regions in the semiconductor fin.

42. The method of claim 36 further comprising:
    forming spacers on the sides of the gate electrode;
    performing selective epitaxy on the portions of the semiconductor fin not covered by the gate electrode; and
    forming source and drain regions.

43. The method of claim 36 wherein the semiconductor fin comprises a silicon fin.

44. The method of claim 36 wherein the semiconductor fin comprises a silicon and germanium fin.

45. The method of claim 36 wherein the gate dielectric comprises silicon oxide.

46. The method of claim 36 wherein the gate dielectric comprises silicon oxynitride.

47. The method of claim 36 wherein the gate dielectric comprises of high permittivity materials with relative permittivity greater than about 5.

48. The method of claim 47 where the gate dielectric comprises a material selected from the group consisting of lanthanum oxide, aluminum oxide, hafnium oxide, hafnium oxynitride, and zirconium oxide, and combinations thereof.

49. The method of claim 36 wherein the gate dielectric has a thickness less than about 10 angstroms.

50. The method of claim 36 wherein the gate electrode material is selected from a group consisting of poly-Si, poly-SiGe, a metallic nitride, a metallic silicide, a metal, and combinations thereof.

51. The method of claim 36 wherein the planarizing layer is formed from a material selected from the group consisting of silicon rich oxide, spin-on glass, silicon oxide, and doped glass.

52. The method of claim 36 wherein the planarizing layer comprises silicon rich oxide and the gate electrode material comprises polysilicon.

53. A method of forming a multiple gate transistor device, the method comprising:
providing a semiconductor structure including a semiconductor fin overlying an insulator layer, and a gate dielectric overlying at least a portion of the semiconductor fin;
forming a gate electrode material over the gate dielectric;
planarizing the gate electrode material to form a gate electrode layer with a substantially planar upper surface;
patterning and etching the gate electrode material to form a gate electrode;
forming spacers on the sides of the gate electrode;
performing selective epitaxy on the portions of the semiconductor fin not covered by the gate electrode; and
forming source and drain regions.

54. The method of claim 53 wherein the semiconductor fin comprises a silicon fin.

55. The method of claim 53 wherein the semiconductor fin comprises a silicon and germanium fin.

56. The method of claim 53 wherein the gate dielectric comprises silicon oxide.

57. The method of claim 53 wherein the gate dielectric comprises silicon oxynitride.

58. The method of claim 53 wherein the gate dielectric comprises of high permittivity materials with relative permittivity greater than about 5.

59. The method of claim 53 wherein the gate dielectric comprises a material selected from the group consisting essentially of lanthanum oxide, aluminum oxide, hafnium oxide, hafnium oxynitride, zirconium oxide, and combinations thereof.

60. The method of claim 53 wherein the gate dielectric has a thickness less than about 10 angstroms.

61. The method of claim 53 wherein the gate electrode material is selected from a group consisting essentially of poly-Si, poly-SiGe, a metallic nitride, a metallic silicide, a metal, and combinations thereof.

62. A method of forming a multiple gate transistor device, the method comprising:
providing a semiconductor structure including a semiconductor fin overlying an insulator layer, and a gate dielectric overlying at least a portion of the semiconductor fin;
forming a first gate electrode material over the gate dielectric;
forming a second gate electrode material over the first gate electrode material;
planarizing the second gate electrode material to form a gate electrode layer with a substantially planar upper surface; and
patterning and etching the gate electrode layer to form a gate electrode.

63. The method of claim 62 wherein the semiconductor fin comprises a silicon and germanium fin.

64. The method of claim 62 wherein the gate dielectric comprises silicon oxide.

65. The method of claim 62 wherein the gate dielectric comprises silicon oxynitride.

66. The method of claim 62 wherein the gate dielectric comprises of high permittivity materials with relative permittivity greater than about 5.

67. The method of claim 62 wherein the gate dielectric comprises a material selected from the group consisting essentially of lanthanum oxide, aluminum oxide, hafnium oxide, hafnium oxynitride, zirconium oxide, and combinations thereof.

68. The method of claim 62 wherein the gate dielectric has a thickness less than about 10 angstroms.

69. The method of claim 62 wherein the first gate electrode material is selected from a group consisting essentially of poly-Si, poly-SiGe, a metallic nitride, a metallic silicide, a metal, and combinations thereof.

* * * * *

UNITED STATES PATENT AND TRADEMARK OFFICE
CERTIFICATE OF CORRECTION

| | | |
|---|---|---|
| PATENT NO. | : 7,005,330 B2 | |
| APPLICATION NO. | : 10/608287 | |
| DATED | : February 28, 2006 | |
| INVENTOR(S) | : Yeo et al. | |

It is certified that error appears in the above-identified patent and that said Letters Patent is hereby corrected as shown below:

<u>Column 5,</u>
Line 64, delete "suicides" and insert -- silicides --.

Signed and Sealed this

Twenty-seventh Day of June, 2006

JON W. DUDAS
*Director of the United States Patent and Trademark Office*